United States Patent
Yu et al.

(10) Patent No.: US 8,680,682 B2
(45) Date of Patent: *Mar. 25, 2014

(54) BARRIER FOR THROUGH-SILICON VIA

(71) Applicant: Taiwan Semiconductor Manufacturing Company, Ltd., Hsin-Chu (TW)

(72) Inventors: Chen-Hua Yu, Hsin-Chu (TW);
Wen-Chih Chiou, Miaoli (TW);
Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/730,162

(22) Filed: Dec. 28, 2012

(65) Prior Publication Data

US 2013/0113105 A1      May 9, 2013

Related U.S. Application Data

(63) Continuation of application No. 12/631,172, filed on Dec. 4, 2009, now Pat. No. 8,344,513.

(60) Provisional application No. 61/162,529, filed on Mar. 23, 2009.

(51) Int. Cl.
  *H01L 23/522*   (2006.01)
  *H01L 21/44*    (2006.01)
(52) U.S. Cl.
  USPC ........... 257/773; 257/741; 257/751; 257/763; 257/E21.171; 257/E21.175; 257/E21.575; 257/E21.584; 438/618; 438/627; 438/653; 438/656

(58) Field of Classification Search
  USPC .................. 257/741, 751, 763, 773, E21.171, 257/E21.175, E21.575, E21.584; 438/618, 438/627, 653, 656
  See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,893,758 A * | 4/1999 | Sandhu et al. | 438/708 |
| 5,998,292 A | 12/1999 | Black et al. | |
| 6,184,060 B1 | 2/2001 | Siniaguine | |
| 6,294,832 B1 * | 9/2001 | Yeh et al. | 257/751 |
| 6,322,903 B1 | 11/2001 | Siniaguine et al. | |
| 6,326,297 B1 | 12/2001 | Vijayendran | |
| 6,448,168 B1 | 9/2002 | Rao et al. | |
| 6,465,892 B1 | 10/2002 | Suga | |
| 6,472,293 B1 | 10/2002 | Suga | |
| 6,522,013 B1 | 2/2003 | Chen et al. | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |

(Continued)

*Primary Examiner* — Dao H Nguyen
(74) *Attorney, Agent, or Firm* — Slater & Matsil, L.L.P.

(57) ABSTRACT

A system and a method for protecting vias is disclosed. An embodiment comprises forming an opening in a substrate. A barrier layer disposed in the opening including along the sidewalls of the opening. The barrier layer may include a metal component and an alloying material. A conductive material is formed on the barrier layer and fills the opening. The conductive material to form a via (e.g., TSV).

20 Claims, 4 Drawing Sheets

(56) References Cited

U.S. PATENT DOCUMENTS

| | | |
|---|---|---|
| 6,740,582 B2 | 5/2004 | Siniaguine |
| 6,800,930 B2 | 10/2004 | Jackson et al. |
| 6,841,883 B1 | 1/2005 | Farnworth et al. |
| 6,881,669 B2 * | 4/2005 | Chu et al. ............... 438/653 |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,772,123 B2 | 8/2010 | Birner et al. |
| 7,863,189 B2 | 1/2011 | Basker et al. |
| 8,344,513 B2 * | 1/2013 | Yu et al. ............... 257/773 |
| 2006/0216932 A1 | 9/2006 | Kumar et al. |
| 2006/0223301 A1 | 10/2006 | Vanhaelemeersch et al. |
| 2007/0205855 A1 | 9/2007 | Hashimoto |
| 2009/0068832 A1 | 3/2009 | Haukka et al. |
| 2009/0280643 A1 | 11/2009 | Andry et al. |
| 2010/0164108 A1 | 7/2010 | Johnston et al. |
| 2010/0237502 A1 | 9/2010 | Yu et al. |
| 2010/0301491 A1 * | 12/2010 | Yang ............... 257/773 |
| 2011/0068470 A1 | 3/2011 | Cohen |

* cited by examiner

BARRIER FOR THROUGH-SILICON VIA

This application is a continuation of U.S. patent application Ser. No. 12/631,172, filed on Dec. 4, 2009, which claims the benefit of U.S. Provisional Patent Application Ser. No. 61/162,529, filed on Mar. 23, 2009, and entitled "Barrier for Through-Silicon Via," the disclosures of which are incorporated herein by reference.

TECHNICAL FIELD

The present invention relates generally to semiconductor devices and, more particularly, to barrier layers for through-silicon vias.

BACKGROUND

Generally, through-silicon vias (TSVs) are formed in a semiconductor wafer by initially forming an opening at least partially through a substrate. A barrier layer is formed to line the opening in order to prevent a later-formed conductive material (e.g., copper) from diffusing into the substrate, where it might deteriorate the overall performance of other devices formed on the semiconductor wafer. As such, this barrier layer prevents damage caused by the conductive material.

However, the barrier layer is typically formed through a physical vapor deposition (PVD) process, which generally has a poor step coverage. This poor step coverage results in the barrier layer having a smaller thickness at the bottom of the TSV opening along the sidewalls, and can induce a problem with the continuity of the barrier. Such a problem with continuity may result in gaps of coverage, which would not only allow conductive material to diffuse into the substrate, but may also cause problems during subsequent electroplating of conductive material into the opening.

One solution to this discontinuity is to simply continue the PVD barrier formation process until the continuity of the barrier layer in the TSV opening has been assured. However, this process also increases the thickness of the barrier layer on the surface of the substrate (outside of the TSV opening). This increase in thickness can cause variation problems after the barrier layer has been removed from the surface by a chemical mechanical polishing (CMP) process.

SUMMARY OF THE INVENTION

These and other problems are generally solved or circumvented, and technical advantages are generally achieved, by embodiments of the present invention which provide for a semiconductor barrier layer that reduces problems associated with processing variations.

In accordance with an embodiment of the present invention, a semiconductor device comprises a substrate having an opening and a liner formed along sidewalls of the opening. A barrier layer overlies the liner along the sidewalls of the openings, and the barrier layer comprises carbon or fluorine. A seed layer overlies the barrier layer along the sidewalls of the opening, and a conductive material is formed on the seed layer and filling the opening.

In accordance with another embodiment of the present invention, a method of manufacturing a semiconductor device comprises providing a substrate with an opening located therein and forming a barrier layer along sidewalls and a bottom of the opening using an atomic layer deposition process. A seed layer is formed overlying the barrier layer and a conductive material is formed on the seed layer filling the opening.

An advantage of an embodiment of the present invention allows for better coverage of the sidewalls without causing variation problems in other parts of the device.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a barrier layer for a through-silicon via (TSV). The invention may also be applied, however, to other barrier layers.

Figure 1:
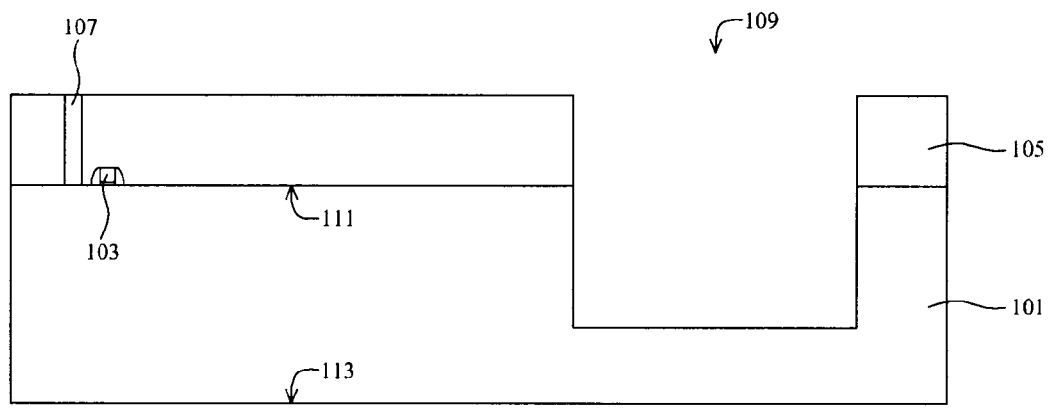
FIG. 1 illustrates a through-silicon via (TSV) opening formed through a substrate and an interlayer dielectric in accordance with an embodiment of the present invention.

With reference now to FIG. 1, there is shown a substrate 101, active devices 103 formed on the substrate 101, an interlayer dielectric (ILD) 105 over the substrate 101, a contact 107 to the active devices 103 through the ILD 105, and an opening 109 formed through the ILD 105 and into the substrate 101. The substrate 101 comprises a first side 111 and a second side 113 opposite the first side 111, and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented on FIG. 1 as a single transistor on the first side 111 of the substrate 101. However, as one of ordinary skill in the art will recognize, a wide variety of active devices such as capacitors, resistors, inductors, combinations of these, or the like may be used to generate the desired structural and functional requirements of the overall design. The active devices 103 may be formed using any suitable methods either within or on the surface of the substrate 101.

The ILD 105 is formed over the substrate 101 and active devices 103 by chemical vapor deposition, sputtering, or any other method known and used in the art for forming an ILD 105. The ILD 105 typically has a planarized surface and may be comprised of silicon oxide, although other materials, such as high-k materials, could alternatively be utilized. Optionally, the ILD 105 may be formed so as to impart a strain to the substrate 101 within the active devices 103, which will increase the overall performance of the active devices 103, as is known in the art.

The contact 107 extends through the ILD 105 to make electrical contact with at least one of the active devices 103. The contact 107 may be formed through the ILD 105 in accordance with known photolithography and etching techniques. Generally, photolithography techniques involve depositing a photoresist material, which is masked, exposed, and developed to expose portions of the ILD 105 that are to be removed. The remaining photoresist material protects the underlying material from subsequent processing steps, such as etching. Photoresist material is utilized to create a patterned mask to define the contact 107. Alternative masks, such as a hardmask, may also be used.

The contact 107 may comprise a barrier/adhesion layer (not shown) to prevent diffusion and provide better adhesion between the contact 107 and the ILD 105. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 10 Å to about 500 Å.

The contact 107 may be formed of any suitable conductive material, such as a highly-conductive, low-resistive metal, elemental metal, transition metal, or the like. In an exemplary embodiment the contacts 107 are formed of tungsten, although other materials, such as copper, could alternatively be utilized. In an embodiment in which the contact 107 is formed of tungsten, the contact 107 may be deposited by CVD techniques known in the art, although any method of formation could alternatively be used.

The opening 109 may be formed by applying and developing a suitable photoresist (not shown), and then etching the ILD 105 and at least a portion of the substrate 101. The opening 109 is formed so as to extend into the substrate 101 at least further than the active devices 103 formed within and on the substrate 101, and at least to a depth greater than the eventual desired height of the substrate 101. Accordingly, while the depth of the opening 109 from the surface of the substrate 101 is dependent upon the overall design of the desired chip, the depth may be between about 20 μm and about 190 μm, such as about 50 μm. Further, the opening 109 may have a diameter of between about 2 μm and about 70 μm, such as about 5 μm.

However, as one of ordinary skill in the art will recognize, the method described to form the opening 109 through only the ILD 105 and the substrate 101 is not the sole method of formation that may be utilized. Alternatively, the opening 109 may be formed concurrently with the formation of the ILD 105 and any other individual layers (e.g., dielectric and metal layers) as the layers are being built upwards from the substrate 101. Any method of formation to form the opening 109 is intended to be included within the scope of the present invention.

Figure 2:
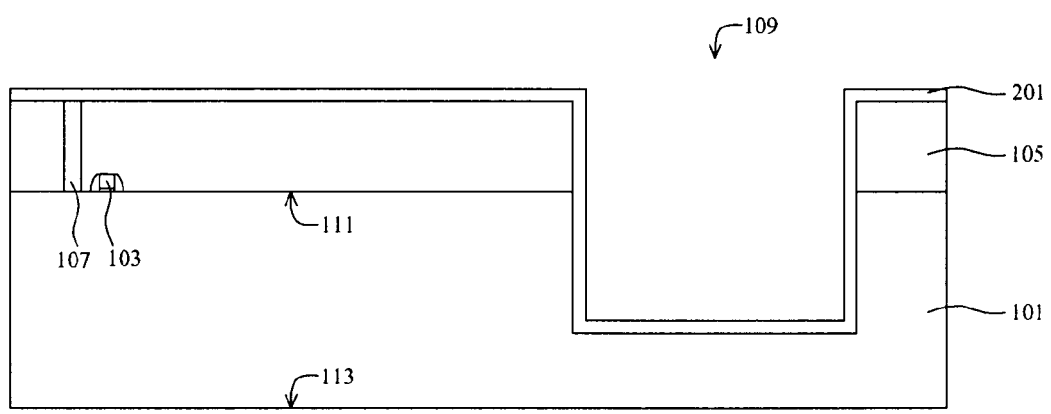
FIG. 2 illustrates the formation of a liner to cover the sidewalls and bottom of the opening in accordance with an embodiment of the present invention.

FIG. 2 illustrates the formation of a liner 201 over the ILD 105, the liner 201 covering the sidewalls and bottom of the opening 109. The liner 201 may be either tetraethylorthosilicate (TEOS) or silicon nitride, although any suitable dielectric may alternatively be used. The liner 201 may be formed using a plasma enhanced chemical vapor deposition (PECVD) process, although other suitable processes, such as physical vapor deposition or a thermal process, may alternatively be used.

Figure 3:
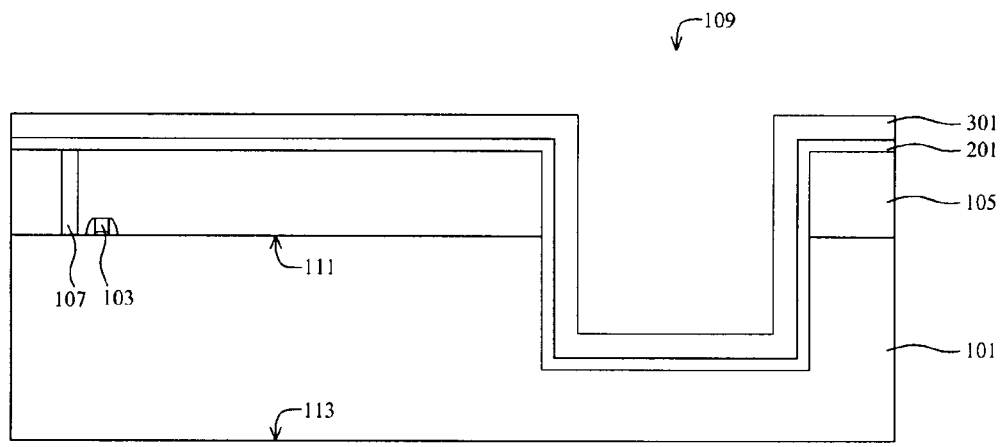
FIG. 3 illustrates the formation of a barrier layer over the liner in accordance with an embodiment of the present invention.

FIG. 3 illustrates the formation of a barrier layer 301 over the liner 201 and also covering the sidewalls and bottom of the opening 109. The barrier layer 301 may be formed so as to conformally cover the liner 201 and the sidewalls and bottom of the TSV opening 109 with a thickness of between about 10 Å and about 1,000 Å, such as between about 20 Å and about 100 Å. By forming the barrier layer 301 conformally, the barrier layer will have a substantially equal thickness along the sidewalls of the opening 109 and also along the bottom of the openings 109, which will reduce or eliminate problems with the continuity of the barrier layer 301 without increasing the thickness of the barrier layer 301 outside of the opening 109.

Furthermore, while the barrier layer 301 may be a completely conformal barrier layer 301, some variation in the conformality of the barrier layer thickness has been found to still have beneficial effects. For example, a barrier layer 301 with variations in thickness of less than about 20% still maintain beneficial effects over prior art methods of forming the barrier layer 301.

The barrier layer 301 may be formed using a process that will promote a conformal formation, such as atomic layer deposition (ALD). In this process the liner 201 is exposed to chemical precursors that may contain carbon or fluorine, such as a metal-organic material or $TaF_5$, that will form a single atomic layer of the material of the barrier layer 301 without the addition of extra material. As such, a completely conformal layer of material is formed. This process is then repeated in order to build up multiple single layers of either the same material or different materials until a desired thickness is obtained.

However, ALD is not the only acceptable method of formation. Other processes such as plasma enhanced chemical vapor deposition (PECVD) or plasma enhanced physical vapor deposition (PEPVD), wherein a bias is applied to the substrate in order to lessen variations in the thickness of the barrier layer 301, may alternatively be used. However, if these processes are used, the process parameters, such as the bias on the substrate, are controlled to at least reduce the variation in the thickness of the barrier layer 301 to below the variation of less than about 20% as described above. Given this, the bias applied to the substrate may range from between about 100 W and about 3000 W, depending upon the process conditions and the depth of the opening 109. As merely one example, for an opening with a depth of about 50 μm, a bias of between about 500 W and about 2,000 W may be applied to the substrate 101.

The barrier layer 301 comprises tantalum nitride, although other materials, such as tantalum, titanium, titanium nitride, combinations of these, and the like may alternatively be used. Additionally, in this embodiment the barrier layer 301 may be alloyed with an alloying material such as carbon or fluorine, although the alloyed material content is generally no greater than about 15% of the barrier layer 301, and may be less than about 5% of the barrier layer 301. The alloying material may be introduced by one of the precursors during formation of the barrier layer 301 in the ALD, PECVD, or PEPVD processes.

Figure 4:
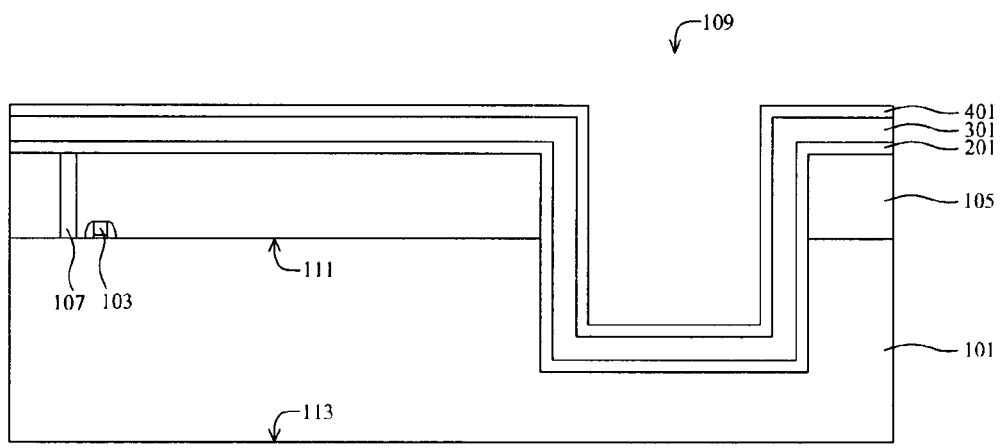
FIG. 4 illustrates the formation of a seed layer over the barrier layer in accordance with an embodiment of the present invention.

FIG. 4 illustrates the formation of a seed layer 401 over the barrier layer 301. The seed layer 401 may be deposited by PVD or CVD, and may be formed of copper, although other methods and materials may alternatively be used if desired. Additionally, while the thickness of the seed layer 401 will be dependent at least in part on the depth of the opening 109, the seed layer 401 may have a thickness of between about 50 Å and about 1,000 Å. For example, for an opening 109 with a depth of about 50 µm, the seed layer 401 may have a depth of between about 50 Å and about 500 Å, such as about 200 Å.

Optionally, the seed layer 401 may also be alloyed with a material that improves the adhesive properties of the seed layer 401 so that it can act as an adhesion layer. For example, the seed layer 401 may be alloyed with a material such as manganese or aluminum, which will migrate to the interface between the seed layer 401 and the barrier layer 301 and will enhance the adhesion between the two layers. The alloying material may be introduced during formation of the seed layer, and may comprise no more than about 10% of the seed layer, such as about less than 5%.

Figure 5:
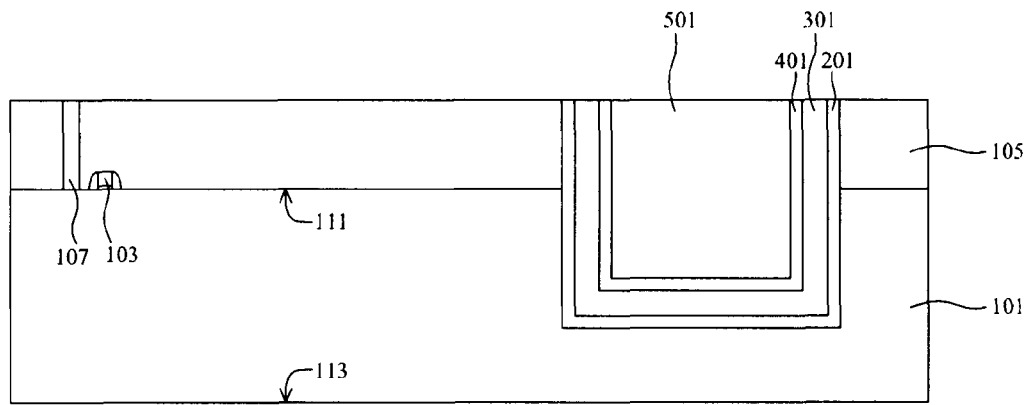
FIG. 5 illustrates the formation of conductive material over the seed layer in accordance with an embodiment of the present invention.

FIG. 5 illustrates the plating of a conductive material 501 onto the seed layer 401. The conductive material 501 may comprise copper, although other suitable materials such as aluminum, alloys, doped polysilicon, combinations thereof, and the like, may alternatively be utilized. The conductive material 501 may be formed by electroplating copper onto the seed layer 401, filling and overfilling the openings 109. Once the openings 109 have been filled, excess liner 201, barrier layer 301, seed layer 401, and conductive material 501 outside of the openings 109 may be removed through a planarization process such as chemical mechanical polishing (CMP), although any suitable removal process may be used.

Figure 6:
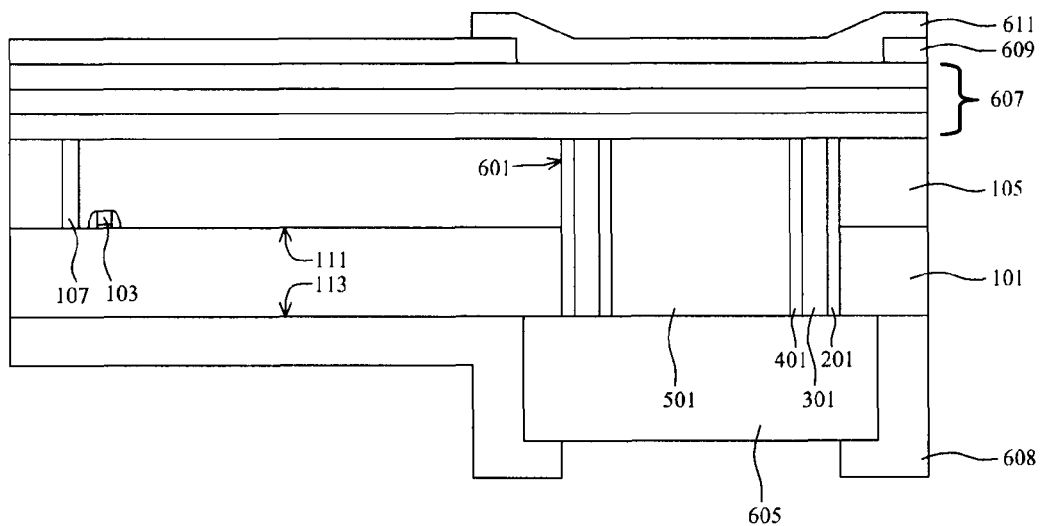
FIG. 6 illustrates the formation of additional connections to the TSV in accordance with an embodiment of the present invention.

FIG. 6 illustrates further process steps in the formation of a TSV. Metallization layers 607 may be formed over the first side 111 of the substrate 101 and are designed to connect the active devices 103 to form functional circuitry and also to form a connection to the second side 113 of the substrate 101 through the TSV 601. The metallization layers 607 may be formed of alternating layers of dielectric and conductive material and may be formed through any suitable process (such as deposition, dual damascene, etc.). Furthermore, while there may be four or more layers of metallization separated from the substrate 101 by the ILD 105, the precise number of metallization layers 607 is dependent upon the overall design of the structure.

A second passivation layer 609 may be formed over the metallization layers 607, in order to seal and protect the metallization layers 607. The second passivation layer 609 may comprise a dielectric material such as an oxide or silicon nitride, although other suitable dielectrics, such as a high-k dielectric or polyimide, may alternatively be used. The second passivation layer 609 may be formed using a PECVD process, although any other suitable process may alternatively be used. The second passivation layer 609 has a thickness of between about 0.6 µm and about 1.4 µm, such as about 1 µm.

Once formed the second passivation layer 609 is patterned to expose at least a portion of an uppermost conductive layer of the metallization layers 607. The second passivation layer 609 may be patterned using a suitable photolithographic technique, wherein a light-sensitive photoresist (not shown) is applied to the second passivation layer 609 exposed and developed to form a photoresist. Once developed, exposed portions of the second passivation layer 609 may be removed using a suitable etchant to expose at least a portion of the uppermost conductive layer of the metallization layers 607.

FIG. 6 also illustrates the formation of an underbump metallization (UBM) 611 through the second passivation layer 609. The UBM 611 is intended to act as an intermediary between the metallization layer 607 and contacts (not shown) that are intended to connect the circuitry to other devices. The UBM 611 may be formed so as to make physical and electrical contact with the uppermost conductive layer of the metallization layers 607. The UBM 611 may be made of at least three layers of conductive materials, such as a layer of chrome, a layer of a chrome-copper alloy, and a layer of copper, with an optional layer of gold over the top of the copper layer. However, one of ordinary skill in the art will recognize that there are many suitable arrangements of materials and layers, such as an arrangement of titanium/titanium tungsten/copper or an arrangement of copper/nickel/gold, that are suitable for the formation of the UBM 611. Any suitable materials or layers of material that may be used for the UBM 611 are fully intended to be included within the scope of the current application.

The UBM 611 may be created by forming each layer conformally over an opening through the second passivation layer 609. The forming of each layer may be performed using a CVD process, such as PECVD, although other processes of formation, such as sputtering, evaporation, or plating process, may alternatively be used depending upon the desired materials. Each of the layers within the UBM 611 may have a thickness of between about 10 µm and about 100 µm, such as about 45 µm. Once the desired layers have been formed, portions of the layers are then removed through a suitable photolithographic masking and etching process to remove the undesired material and to leave the patterned UBM 611.

Once excess conductive material 501 has been removed from the front side of the substrate 101, portions of the second side 113 of the substrate 101 are then removed to expose the conductive material 501 located within the opening 109 to complete the TSV 601. The removal may be performed with a grinding process such as a chemical mechanical polish (CMP), although other suitable processes, such as etching, may alternatively be used. The removal of the second side 113 of the substrate 101 may be continued until the substrate 101 has a thickness of between about 10 µm and about 200 µm, such as between about 25 µm and about 100 µm.

After the removal of a portion of the second side 113 of the substrate 101, a second etch may be performed. This second etch is intended to clean and polish the substrate 101 after the CMP. Additionally, this second etch also helps release stresses that may have formed during the CMP process of grinding the substrate 101. The second etch may use $HNO_3$, although other suitable etchants may alternatively be used.

Finally, after a cleaning process to remove any remaining polishing residue such as copper oxide, a contact 605 may be formed on the second side 113 of the substrate 101 in electrical contact with the conductive material 501 located within the TSV 601. The contact 605 may comprise a conductive layer (not shown) and an ENIG layer (not shown). The conductive layer may comprise aluminum and may be formed through a sputter deposition process. However, other materials, such as nickel or copper, and other formation processes, such as electroplating or electroless plating, may alternatively be used. The conductive layer may be formed with a thickness of between about 0.5 μm and about 3 μm, such as about 2 μm.

The formation of the conductive layer may be followed by an Electroless Nickel Gold (ENIG) process to form an ENIG layer opposite the conductive layer from the substrate 101. The ENIG process provides for a flat, uniform metal surface finish for the formation of contacts to other devices (not shown). The ENIG process may comprise cleaning the conductive layer, immersing the substrate 101 in a zincate activation solution, electrolessly plating nickel onto the conductive layer, and electrolessly plating gold onto the nickel. The ENIG layer may be formed to a thickness of between about 2 μm and about 4 μm, such as about 3 μm. Once formed, the conductive layer and the ENIG layer are patterned into the shape of the contact 605 by a suitable photolithographic process and unwanted material is removed through a suitable etching process.

A first passivation layer 608 may be formed over the contact 605 in order to seal and protect the structures on the second side 113 of the substrate 101. The first passivation layer 608 may comprise a dielectric material such as an oxide or silicon nitride, although other suitable dielectrics, such as a high-k dielectric, may alternatively be used. The first passivation layer 608 may be formed using a plasma enhanced chemical vapor deposition (PECVD) process, although any other suitable process may alternatively be used. The first passivation layer 608 may have a thickness of between about 0.6 μm and about 1.4 μm, such as about 1 μm. Once formed, the first passivation layer 608 may be patterned using a suitable masking and etching technique in order to expose at least a portion of the contact 605, in order to allow exterior devices (not shown) to be connected to the contact 605.

Figure 7:
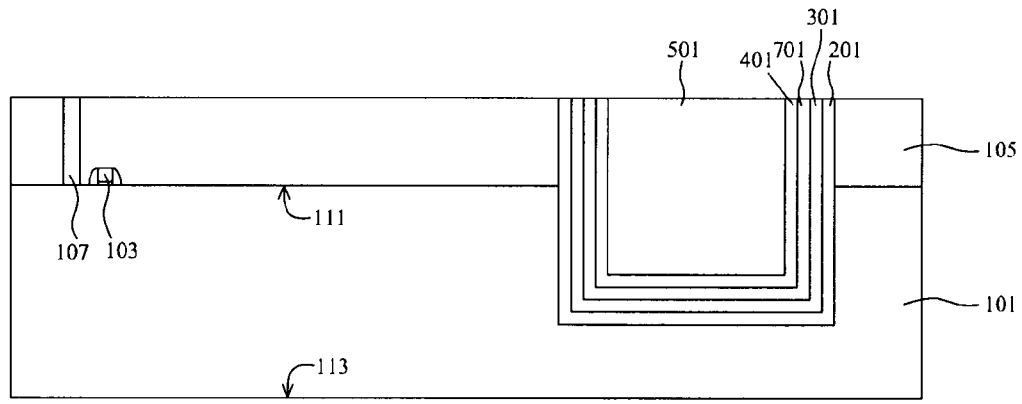
FIG. 7 illustrates an embodiment of the present invention in which an adhesion layer is formed between a liner and a barrier layer in accordance with an embodiment of the present invention.

FIG. 7 illustrates an alternative embodiment of the present invention. In this embodiment, the substrate 101, the ILD 105, the opening 109, liner 201, and the barrier layer 301 may be formed in a similar manner as the method described above with respect to FIGS. 1-2. In this embodiment, a first adhesion layer 701 is formed between the barrier layer 301 and the seed layer 401. The first adhesion layer 701 may be formed of a combination of tantalum and tantalum nitride using a PVD process, although other adhesive materials, such as titanium or titanium nitride, and other methods of formation, such as CVD or ALD, may alternatively be utilized. The first adhesion layer 701 may comprise a first adhesive layer of tantalum with a thickness of between about 10 Å and about 300 Å, such as about 150 Å, and a second adhesive layer of tantalum nitride with a thickness between about 10 Å and about 100 Å, such as about 30 Å.

Additionally, because the first adhesion layer 701 is used at the interface of the barrier layer 301 and the seed layer 401, the seed layer 401 may not contain the adhesive alloys that were utilized to enhance the adhesion of the seed layer 401 to the barrier layer 301 in the embodiment described above with respect to FIGS. 1-6. As such, a pure conductive material, such as pure copper, may be utilized for the seed layer 401 with this addition of a separate adhesive layer such as tantalum.

In this embodiment, once the seed layer 401 has been formed, the remainder of the formation process may be completed in a similar fashion as the method described above with respect to FIGS. 1-6.

Figure 8:
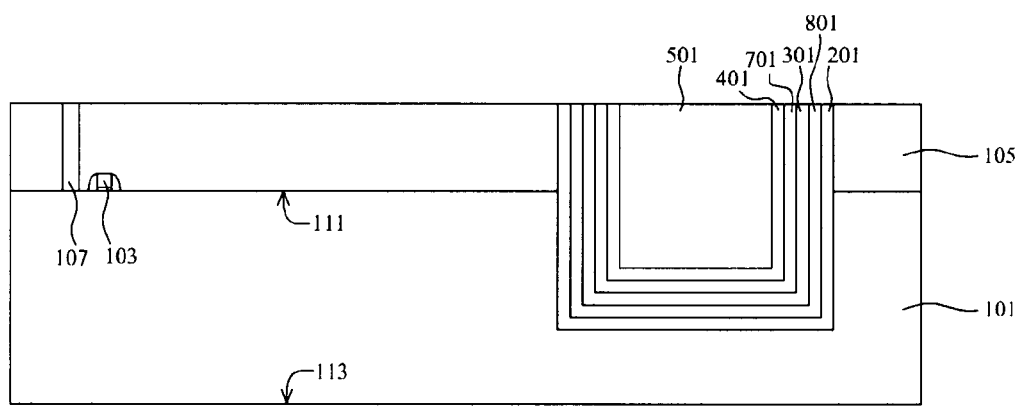
FIG. 8 illustrates an embodiment of the present invention in which adhesion layers are formed on opposing sides of the barrier layer.

FIG. 8 illustrates an alternative to the embodiment described above in FIG. 7. In this embodiment, in addition to the first adhesion layer 701 formed between the barrier layer 301 and the seed layer 401, a second adhesion layer 801 is formed between the barrier layer 301 and the liner 201. In this fashion, the first adhesion layer 701 and the second adhesion layer 801 are located on either side of the barrier layer 301. Furthermore, in this embodiment, the second adhesion layer 801 may be formed of similar materials and in a similar fashion as the first adhesion layer 701 described above with respect to FIG. 7.

Although the present invention and its advantages have been described in detail, it should be understood that various changes, substitutions and alterations can be made herein without departing from the spirit and scope of the invention as defined by the appended claims. For example, the openings may be formed in a variety of methods, and the barrier layer may be formed using a variety of conformal methods.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a semiconductor substrate having an opening defined by sidewalls;
    a barrier layer disposed along the sidewalls of the opening, the barrier layer including a metal component and an alloying material, wherein the alloying material is less than approximately 15% of the barrier layer; and
    a conductive material formed on the barrier layer and filling the opening, the conductive material to form a via.

2. The semiconductor device of claim 1, wherein the via is a through substrate via.

3. The semiconductor device of claim 1, wherein the metal component of the barrier layer is selected from the group consisting of Ta, TaN, Ti, TiN, and combinations thereof.

4. The semiconductor device of claim 1, wherein the alloying material is fluorine and the content of fluorine is less than approximately 5% of the barrier layer.

5. The semiconductor device of claim 1, wherein the alloying material is carbon and the content of carbon is less than approximately 5% of the barrier layer.

6. A semiconductor device comprising:
    a semiconductor substrate having an opening;
    a barrier layer on sidewalls of the opening, wherein the barrier layer has a first surface and an opposing second surface, and wherein the barrier layer includes a composition having a metal component and a fluorine alloying material from the first surface to the second surface; and
    a conductive material formed on the barrier layer and filling the opening, the conductive material extending from a front surface of the semiconductor substrate to a back surface of the semiconductor substrate.

7. The semiconductor device of claim 6, wherein the content of fluorine of the fluorine alloying material is no more than about 15% of the barrier layer.

8. The semiconductor device of claim 6, further comprising:

a liner formed along sidewalls of the opening, the liner comprising a dielectric material.

9. The semiconductor device of claim 8, wherein the liner comprises an oxide layer or a silicon nitride layer.

10. The semiconductor device of claim 8, further comprising an adhesion layer between the barrier layer and the liner.

11. The semiconductor device of claim 6, further comprising an adhesion layer between the barrier layer and the conductive material layer.

12. The semiconductor device of claim 11, wherein the adhesion layer comprises Ta or TaN.

13. The semiconductor device of claim 6, wherein the barrier layer comprises tantalum nitride, tantalum, titanium, titanium nitride or combinations thereof.

14. A method of manufacturing a semiconductor device comprising:
    providing a substrate with an opening located therein;
    forming a dielectric liner along sidewalls of the opening;
    forming a barrier layer over the liner and along the sidewalls and a bottom of the opening using a deposition process wherein the deposition process includes depositing a metal component while introducing an alloying material into the barrier layer during the deposition process, wherein the alloying material comprises fluorine, with a content of not more than about 15%;
    forming a conductive material on the barrier layer having the metal component and the alloying material, wherein the forming the conductive material includes filling the opening; and
    removing a portion of the substrate to expose the conductive material.

15. The method of claim 14, further comprising:
    forming an adhesion layer on the barrier layer prior to the forming the conductive material.

16. The method of claim 14, further comprising: forming a seed layer including at least one of manganese and aluminum on the barrier layer and underlying the conductive material.

17. The method of claim 14, further comprising: forming an adhesion layer along the sidewalls and bottom of the opening prior to the forming the barrier layer.

18. The method of claim 14, wherein the barrier layer comprises tantalum nitride, tantalum, titanium, titanium nitride or combinations thereof.

19. The method of claim 14, wherein the content of fluorine in the barrier layer is less than approximately 5 percent.

20. The method of claim 14, wherein the deposition process is an atomic layer deposition (ALD).

* * * * *